United States Patent
James (10) Patent No.: US 7,251,714 B2
(45) Date of Patent: Jul. 31, 2007

(54) METHOD AND SYSTEM FOR CAPTURING AND BYPASSING MEMORY TRANSACTIONS IN A HUB-BASED MEMORY SYSTEM

(75) Inventor: Ralph James, Andover, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/418,933

(22) Filed: May 4, 2006

(65) Prior Publication Data

US 2006/0200602 A1 Sep. 7, 2006

Related U.S. Application Data

(63) Continuation of application No. 10/645,288, filed on Aug. 20, 2003, now Pat. No. 7,133,991.

(51) Int. Cl.
    *G06F 13/00* (2006.01)
(52) U.S. Cl. ...................... 711/167; 711/154
(58) Field of Classification Search ................ 711/154, 711/167
    See application file for complete search history.

(56) References Cited

U.S. PATENT DOCUMENTS

| | | | |
|---|---|---|---|
| 3,742,253 A | 6/1973 | Kronies | 307/247 |
| 4,045,781 A | 8/1977 | Levy et al. | 364/200 |
| 4,240,143 A | 12/1980 | Besemer et al. | 364/200 |
| 4,245,306 A | 1/1981 | Besemer et al. | 364/200 |
| 4,253,144 A | 2/1981 | Bellamy et al. | 364/200 |
| 4,253,146 A | 2/1981 | Bellamy et al. | 364/200 |
| 4,608,702 A | 8/1986 | Hirzel et al. | 375/110 |
| 4,707,823 A | 11/1987 | Holdren et al. | 370/1 |
| 4,724,520 A | 2/1988 | Athanas et al. | 364/200 |
| 4,831,520 A | 5/1989 | Rubinfeld et al. | 364/200 |

(Continued)

FOREIGN PATENT DOCUMENTS

EP 0 709 786 A1 5/1996

(Continued)

OTHER PUBLICATIONS

"Free On-Line Dictionary of Computing" entry Flash Erasable Programmable Read-Only Memory, online May 17, 2004 [http://foldoc.doc.ic.ac.uk/foldoc/foldoc.cgi?flash+memory].

(Continued)

*Primary Examiner*—Reba I. Elmore
(74) *Attorney, Agent, or Firm*—Dorsey & Whitney, LLP (57) ABSTRACT

A memory hub includes a reception interface that receives data words and captures the data words in response to a first clock signal in a first time domain. The interface also provides groups of the captured data words on an output in response to a second clock signal in a second time domain. A transmission interface is coupled to the reception interface to receive the captured data words and captures the data words in response to a third clock signal in the first time domain. This interface provides the captured data words on an output. Local control circuitry is coupled to the output of the reception interface to receive the groups of data words and develops memory requests corresponding to the groups of data words. The first clock domain is defined by clock signals having frequencies higher than frequencies of clock signals in the second clock domain.

31 Claims, 4 Drawing Sheets

U.S. PATENT DOCUMENTS

| | | | |
|---|---|---|---|
| 4,891,808 A | 1/1990 | Williams | 370/112 |
| 4,930,128 A | 5/1990 | Suzuki et al. | 371/12 |
| 4,953,930 A | 9/1990 | Ramsey et al. | 350/96.11 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,313,590 A | 5/1994 | Taylor | 395/325 |
| 5,317,752 A | 5/1994 | Jewett et al. | 395/750 |
| 5,319,755 A | 6/1994 | Farmwald et al. | 395/325 |
| 5,327,553 A | 7/1994 | Jewett et al. | 395/575 |
| 5,355,391 A | 10/1994 | Horowitz et al. | 375/36 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,497,476 A | 3/1996 | Oldfield et al. | 395/439 |
| 5,502,621 A | 3/1996 | Schumacher et al. | 361/760 |
| 5,544,319 A | 8/1996 | Acton et al. | 395/200.07 |
| 5,566,325 A | 10/1996 | Bruce, II et al. | 395/494 |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,638,334 A | 6/1997 | Farmwald et al. | 365/230.03 |
| 5,659,798 A | 8/1997 | Blumrich et al. | 395/846 |
| 5,687,325 A | 11/1997 | Chang | 395/284 |
| 5,706,224 A | 1/1998 | Srinivasan et al. | 365/49 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,818,844 A | 10/1998 | Singh et al. | 370/463 |
| 5,819,304 A | 10/1998 | Nilsen et al. | 711/5 |
| 5,822,255 A | 10/1998 | Uchida | 365/194 |
| 5,832,250 A | 11/1998 | Whittaker | 395/471 |
| 5,875,352 A | 2/1999 | Gentry et al. | 395/843 |
| 5,875,454 A | 2/1999 | Craft et al. | 711/113 |
| 5,928,343 A | 7/1999 | Farmwald et al. | 710/104 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,011,741 A | 1/2000 | Wallace et al. | 365/221 |
| 6,023,726 A | 2/2000 | Saksena | 709/219 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,038,630 A | 3/2000 | Foster et al. | 710/132 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,067,649 A | 5/2000 | Goodwin | 714/718 |
| 6,073,190 A | 6/2000 | Rooney | 710/56 |
| 6,076,139 A | 6/2000 | Welker et al. | 711/104 |
| 6,079,008 A | 6/2000 | Clery, III | 712/11 |
| 6,098,158 A | 8/2000 | Lay et al. | 711/162 |
| 6,100,735 A | 8/2000 | Lu | 327/158 |
| 6,105,075 A | 8/2000 | Ghaffari | 710/5 |
| 6,125,431 A | 9/2000 | Kobayashi | 711/154 |
| 6,131,149 A | 10/2000 | Lu et al. | 711/167 |
| 6,134,624 A | 10/2000 | Burns et al. | 710/131 |
| 6,137,709 A | 10/2000 | Boaz et al. | 365/51 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,208,180 B1 | 3/2001 | Fisch et al. | 327/141 |
| 6,219,725 B1 | 4/2001 | Diehl et al. | 710/26 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,692 B1 | 7/2001 | Yoda et al. | 710/104 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,289,068 B1 | 9/2001 | Hassoun et al. | 375/376 |
| 6,294,937 B1 | 9/2001 | Crafts et al. | 327/158 |
| 6,301,637 B1 | 10/2001 | Krull et al. | 711/112 |
| 6,324,485 B1 * | 11/2001 | Ellis | 702/117 |
| 6,327,642 B1 | 12/2001 | Lee et al. | 711/120 |
| 6,330,205 B2 | 12/2001 | Shimizu et al. | 365/230.06 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,367,074 B1 | 4/2002 | Bates et al. | 717/11 |
| 6,370,068 B2 | 4/2002 | Rhee | 365/196 |
| 6,373,777 B1 | 4/2002 | Suzuki | 365/230.03 |
| 6,381,190 B1 | 4/2002 | Shinkai | 365/230.03 |
| 6,392,653 B1 | 5/2002 | Malandain et al. | 345/501 |
| 6,401,213 B1 | 6/2002 | Jeddeloh | 713/401 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,434,639 B1 | 8/2002 | Haghighi | 710/39 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,449,308 B1 | 9/2002 | Knight, Jr. et al. | 375/212 |
| 6,453,393 B1 | 9/2002 | Holman et al. | 711/154 |
| 6,462,978 B2 | 10/2002 | Shibata et al. | 365/63 |
| 6,463,059 B1 | 10/2002 | Movshovich et al. | 370/389 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,487,556 B1 | 11/2002 | Downs et al. | 707/101 |
| 6,490,188 B2 | 12/2002 | Nuxoll et al. | 365/63 |
| 6,493,803 B1 | 12/2002 | Pham et al. | 711/147 |
| 6,496,909 B1 | 12/2002 | Schimmel | 711/163 |
| 6,501,471 B1 | 12/2002 | Venkataraman et al. | 345/424 |
| 6,505,287 B2 | 1/2003 | Uematsu | 711/170 |
| 6,523,092 B1 | 2/2003 | Fanning | 711/134 |
| 6,523,093 B1 | 2/2003 | Bogin et al. | 711/137 |
| 6,526,483 B1 | 2/2003 | Cho et al. | 711/154 |
| 6,539,490 B1 | 3/2003 | Forbes et al. | 713/401 |
| 6,552,564 B1 | 4/2003 | Forbes et al. | 326/30 |
| 6,564,329 B1 | 5/2003 | Cheung et al. | 713/322 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,615,325 B2 | 9/2003 | Mailloux et al. | 711/154 |
| 6,622,188 B1 | 9/2003 | Goodwin et al. | 710/101 |
| 6,622,227 B2 | 9/2003 | Zumkehr et al. | 711/167 |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,636,110 B1 | 10/2003 | Ooishi et al. | 327/565 |
| 6,636,912 B2 | 10/2003 | Ajanovic et al. | 710/105 |
| 6,646,929 B1 | 11/2003 | Moss et al. | 365/194 |
| 6,658,509 B1 | 12/2003 | Bonella et al. | 710/100 |

| Patent No. | Date | Inventor | Class |
|---|---|---|---|
| 6,662,304 B2 | 12/2003 | Keeth et al. | 713/400 |
| 6,665,202 B2 | 12/2003 | Lindahl et al. | 365/49 |
| 6,667,895 B2 | 12/2003 | Jang et al. | 365/63 |
| 6,681,292 B2 | 1/2004 | Creta et al. | 711/119 |
| 6,697,926 B2 | 2/2004 | Johnson et al. | 711/167 |
| 6,715,018 B2 | 3/2004 | Farnworth et al. | 710/300 |
| 6,718,440 B2 | 4/2004 | Maiyuran et al. | 711/137 |
| 6,721,195 B2 | 4/2004 | Brunelle et al. | 365/63 |
| 6,721,860 B2 | 4/2004 | Klein | 711/154 |
| 6,724,685 B2 | 4/2004 | Braun et al. | 365/233 |
| 6,728,800 B1 | 4/2004 | Lee et al. | 710/54 |
| 6,735,679 B1 | 5/2004 | Herbst et al. | 711/167 |
| 6,735,682 B2 | 5/2004 | Segelken et al. | 711/220 |
| 6,742,098 B1 | 5/2004 | Halbert et al. | 711/172 |
| 6,745,275 B2 | 6/2004 | Chang | 710/305 |
| 6,751,703 B2 | 6/2004 | Chilton | 711/113 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,775,747 B2 | 8/2004 | Venkatraman | 711/137 |
| 6,782,435 B2 | 8/2004 | Garcia et al. | 710/33 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/105 |
| 6,807,630 B2 | 10/2004 | Lay et al. | 713/2 |
| 6,811,320 B1 | 11/2004 | Abbott | 385/58 |
| 6,816,947 B1 | 11/2004 | Huffman | 711/151 |
| 6,820,181 B2 | 11/2004 | Jeddeloh et al. | 711/169 |
| 6,821,029 B1 | 11/2004 | Grung et al. | 385/92 |
| 6,823,023 B1 | 11/2004 | Hannah | 375/296 |
| 6,845,409 B1 | 1/2005 | Talagala et al. | 710/20 |
| 6,889,304 B2 | 5/2005 | Perego et al. | 711/170 |
| 6,901,494 B2 | 5/2005 | Zumkehr et al. | 711/167 |
| 6,904,556 B2 | 6/2005 | Walton et al. | 714/766 |
| 6,910,109 B2 | 6/2005 | Holman et al. | 711/156 |
| 6,912,612 B2 | 6/2005 | Kapur et al. | 710/309 |
| 6,947,672 B2 | 9/2005 | Jiang et al. | 398/135 |
| 6,980,042 B2 | 12/2005 | LaBerge | 327/291 |
| 7,046,060 B1 | 5/2006 | Minzoni et al. | 327/158 |
| 2001/0039612 A1 | 11/2001 | Lee | 713/2 |
| 2002/0112119 A1 | 8/2002 | Halbert et al. | 711/115 |
| 2002/0116588 A1 | 8/2002 | Beckert et al. | 711/161 |
| 2002/0144064 A1 | 10/2002 | Fanning | 711/144 |
| 2003/0005223 A1 | 1/2003 | Coulson et al. | 711/118 |
| 2003/0005344 A1 | 1/2003 | Bhamidipati et al. | 713/400 |
| 2003/0043158 A1 | 3/2003 | Wasserman et al. | 345/545 |
| 2003/0043426 A1 | 3/2003 | Baker et al. | 359/109 |
| 2003/0093630 A1 | 5/2003 | Richard et al. | 711/154 |
| 2003/0101312 A1 | 5/2003 | Doan et al. | 710/313 |
| 2003/0149809 A1 | 8/2003 | Jensen et al. | 710/22 |
| 2003/0156581 A1 | 8/2003 | Osborne | 370/389 |
| 2003/0163649 A1 | 8/2003 | Kapur et al. | 711/146 |
| 2003/0177320 A1 | 9/2003 | Sah et al. | 711/158 |
| 2003/0193927 A1 | 10/2003 | Hronik | 370/351 |
| 2003/0217223 A1 | 11/2003 | Nino, Jr. et al. | 711/105 |
| 2003/0227798 A1 | 12/2003 | Pax | 365/189.12 |
| 2003/0229762 A1 | 12/2003 | Maiyuran et al. | 711/137 |
| 2003/0229770 A1 | 12/2003 | Jeddeloh | 711/213 |
| 2004/0022094 A1 | 2/2004 | Radhakrishnan et al. | 365/200 |
| 2004/0024959 A1 | 2/2004 | Taylor | 711/105 |
| 2004/0024978 A1 | 2/2004 | Jeddeloh | 711/154 |
| 2004/0028412 A1 | 2/2004 | Murphy | 398/135 |
| 2004/0034753 A1 | 2/2004 | Jeddeloh | 711/163 |
| 2004/0034825 A1 | 2/2004 | Jeddeloh | 714/733 |
| 2004/0044833 A1 | 3/2004 | Ryan | 711/5 |
| 2004/0044857 A1 | 3/2004 | Jeddeloh et al. | 711/154 |
| 2004/0047169 A1 | 3/2004 | Lee et al. | 365/63 |
| 2004/0126115 A1 | 7/2004 | Levy et al. | 398/116 |
| 2004/0128449 A1 | 7/2004 | Osborne et al. | 711/137 |
| 2004/0144994 A1 | 7/2004 | Lee et al. | 257/200 |
| 2004/0236885 A1 | 11/2004 | Fredriksson et al. | 710/100 |
| 2004/0251929 A1 | 12/2004 | Pax et al. | 326/30 |
| 2004/0257890 A1 | 12/2004 | Lee et al. | 365/200 |
| 2004/0260864 A1 | 12/2004 | Lee et al. | 711/101 |
| 2004/0260891 A1 | 12/2004 | Jeddeloh et al. | 711/154 |
| 2004/0260909 A1 | 12/2004 | Lee et al. | 711/213 |
| 2004/0260957 A1 | 12/2004 | Jeddeloh et al. | 713/300 |
| 2005/0015426 A1 | 1/2005 | Woodruff et al. | 709/200 |
| 2005/0021884 A1 | 1/2005 | Jeddeloh | 710/22 |
| 2005/0044327 A1 | 2/2005 | Howard et al. | 711/147 |
| 2005/0044457 A1 | 2/2005 | Jeddeloh | 714/718 |
| 2005/0050237 A1 | 3/2005 | Jeddeloh | 710/10 |
| 2005/0050255 A1 | 3/2005 | Jeddeloh | 710/317 |
| 2005/0060600 A1 | 3/2005 | Jeddeloh | 714/5 |
| 2005/0066136 A1 | 3/2005 | Schnepper | 711/154 |
| 2005/0066137 A1 | 3/2005 | Jeddeloh et al. | 711/154 |
| 2005/0071542 A1 | 3/2005 | Weber et al. | 711/105 |
| 2005/0086441 A1 | 4/2005 | Meyer et al. | 711/158 |
| 2005/0091464 A1 | 4/2005 | James | 711/167 |
| 2005/0105350 A1 | 5/2005 | Zimmerman | 365/201 |
| 2005/0132159 A1 | 6/2005 | Jeddeloh | 711/167 |
| 2005/0144403 A1 | 6/2005 | Jeddeloh | 711/154 |
| 2005/0146943 A1 | 7/2005 | Jeddeloh | 365/189.05 |
| 2005/0149603 A1 | 7/2005 | DeSota et al. | 709/200 |
| 2005/0149774 A1 | 7/2005 | Jeddeloh et al. | 713/500 |
| 2005/0160201 A1 | 7/2005 | Jeddeloh | 710/22 |
| 2005/0166006 A1 | 7/2005 | Talbot et al. | 711/105 |
| 2005/0172084 A1 | 8/2005 | Jeddeloh | 711/154 |
| 2005/0177677 A1 | 8/2005 | Jeddeloh | 711/100 |
| 2005/0177690 A1 | 8/2005 | LaBerge | 711/154 |
| 2005/0177695 A1 | 8/2005 | Larson et al. | 711/167 |
| 2005/0210216 A1 | 9/2005 | Jobs et al. | 711/170 |
| 2005/0213611 A1 | 9/2005 | James | 370/503 |
| 2005/0216648 A1 | 9/2005 | Jeddeloh | 710/311 |
| 2005/0216677 A1 | 9/2005 | Jeddeloh et al. | 711/150 |
| 2005/0216678 A1 | 9/2005 | Jeddeloh | 711/154 |
| 2005/0218956 A1 | 10/2005 | LaBerge | 327/291 |
| 2005/0223161 A1 | 10/2005 | Jeddeloh | 711/105 |
| 2005/0228939 A1 | 10/2005 | Janzen | 711/105 |
| 2005/0257005 A1 | 11/2005 | Jeddeloh | 711/115 |
| 2005/0257021 A1 | 11/2005 | James | 711/170 |
| 2005/0268060 A1 | 12/2005 | Cronin et al. | 711/167 |
| 2005/0283681 A1 | 12/2005 | Jeddeloh | 714/42 |
| 2005/0286506 A1 | 12/2005 | LaBerge | 370/363 |
| 2006/0022724 A1 | 2/2006 | Zerbe et al. | 327/141 |
| 2006/0066375 A1 | 3/2006 | LaBerge | 327/291 |
| 2006/0136683 A1 | 6/2006 | Meyer et al. | 711/154 |

FOREIGN PATENT DOCUMENTS

| | | |
|---|---|---|
| EP | 0849685 A2 | 6/1998 |
| JP | 2001265539 A | 9/2001 |
| WO | WO 93/19422 | 9/1993 |
| WO | WO 02/27499 A2 | 4/2002 |

OTHER PUBLICATIONS

Intel, "Flash Memory PCI Add-In Card for Embedded Systems", Application Note AP-758, Sep. 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/ 1GB (x72, ECC) 168-PIN Registered FBGA SDRAM DIMM", Micron Technology, Inc., 2002, pp. 1-23.

Rambus, Inc., "Direct Rambus™ Technology Disclosure", Oct. 1997. pp. 1-16.

Shanley, T. et al., "PCI System Architecture", Third Edition, Mindshare, Inc., 1995, pp. 24-25.

* cited by examiner

METHOD AND SYSTEM FOR CAPTURING AND BYPASSING MEMORY TRANSACTIONS IN A HUB-BASED MEMORY SYSTEM

CROSS-REFERENCE TO RELATED APPLICATION

This application is a continuation of U.S. patent application Ser. No. 10/645,288, filed Aug. 20, 2003 now U.S. Pat. No. 7,133,991.

TECHNICAL FIELD

This invention relates to computer systems, and, more particularly, to a computer system including a system memory having a memory hub architecture.

BACKGROUND OF THE INVENTION

Computer systems use memory devices, such as dynamic random access memory ("DRAM") devices, to store data that are accessed by a processor. These memory devices are normally used as system memory in a computer system. In a typical computer system, the processor communicates with the system memory through a processor bus and a memory controller. The processor issues a memory request, which includes a memory command, such as a read command, and an address designating the location from which data or instructions are to be read. The memory controller uses the command and address to generate appropriate command signals as well as row and column addresses, which are applied to the system memory. In response to the commands and addresses, data are transferred between the system memory and the processor. The memory controller is often part of a system controller, which also includes bus bridge circuitry for coupling the processor bus to an expansion bus, such as a PCI bus.

Although the operating speed of memory devices has continuously increased, this increase in operating speed has not kept pace with increases in the operating speed of processors. Even slower has been the increase in operating speed of memory controllers coupling processors to memory devices. The relatively slow speed of memory controllers and memory devices limits the data bandwidth between the processor and the memory devices.

In addition to the limited bandwidth between processors and memory devices, the performance of computer systems is also limited by latency problems that increase the time required to read data from system memory devices. More specifically, when a memory device read command is coupled to a system memory device, such as a synchronous DRAM ("SDRAM") device, the read data are output from the SDRAM device only after a delay of several clock periods. Therefore, although SDRAM devices can synchronously output burst data at a high data rate, the delay in initially providing the data can significantly slow the operating speed of a computer system using such SDRAM devices.

One approach to alleviating the memory latency problem is to use multiple memory devices coupled to the processor through a memory hub. In a memory hub architecture, a system controller or memory controller is coupled over a high speed data link to several memory modules. Typically, the memory modules are coupled in a point-to-point or daisy chain architecture such that the memory modules are connected one to another in series. Thus, the memory controller is coupled to a first memory module over a first high speed data link, with the first memory module connected to a second memory module through a second high speed data link, and the second memory module coupled to a third memory module through a third high speed data link, and so on in a daisy chain fashion.

Each memory module includes a memory hub that is coupled to the corresponding high speed data links and a number of memory devices on the module, with the memory hubs efficiently routing memory requests and responses between the controller and the memory devices over the high speed data links. Computer systems employing this architecture can have a higher bandwidth because a processor can access one memory device while another memory device is responding to a prior memory access. For example, the processor can output write data to one of the memory devices in the system while another memory device in the system is preparing to provide read data to the processor. Moreover, this architecture also provides for easy expansion of the system memory without concern for degradation in signal quality as more memory modules are added, such as occurs in conventional multi drop bus architectures.

Although computer systems using memory hubs may provide superior performance, they nevertheless may often fail to operate at optimum speeds for a variety of reasons. For example, even though memory hubs can provide computer systems with a greater memory bandwidth, they still suffer from latency problems of the type described above. More specifically, although the processor may communicate with one memory device while another memory device is preparing to transfer data, it is sometimes necessary to receive data from one memory device before the data from another memory device can be used. In the event data must be received from one memory device before data received from another memory device can be used, the latency problem continues to slow the operating speed of such computer systems.

Another factor that can reduce the speed of memory transfers in a memory hub system is the delay in forwarding memory requests from one memory hub to another. For example, in a system including five memory modules (i.e. five memory hubs with one per module), a memory request to read data from the fifth module that is farthest "downstream" from the memory controller will be delayed in being applied to the fifth memory module due to the intervening delays introduced by the first through fourth memory modules in processing and forwarding the memory request. Moreover, where the applied command is a command to read data from a memory module, the longer the delay in applying the read command to the memory module the longer it will take for the memory module to provide the corresponding read data, increasing the latency of the module. The farther downstream a memory module the longer the delay in applying a memory request and the greater the latency in reading data, lowering the bandwidth of the system memory.

Still another concern with a memory hub architecture is the complexity of the circuitry required to form each memory hub. Complex circuitry increases the cost of each memory hub, which increases the cost of each memory module and the overall cost of system memory as modules are added. As the functions each memory hub must perform increase, the complexity of the circuitry increases accordingly. In one implementation of a memory hub architecture, each hub must determine whether a given memory request is directed to that module. If the memory request is directed to the module, the hub processes the request, and if not the request is forwarded to the next downstream hub. A variety of other functions must also be performed by each memory hub, such as generating all the control, data, and address signals for accessing the memory devices on the memory module.

There is therefore a need for a computer architecture that provides the advantages of a memory hub architecture and also minimizes delays in processing downstream memory requests to provide a high bandwidth system memory.

DETAILED DESCRIPTION OF THE INVENTION

Figure 1:
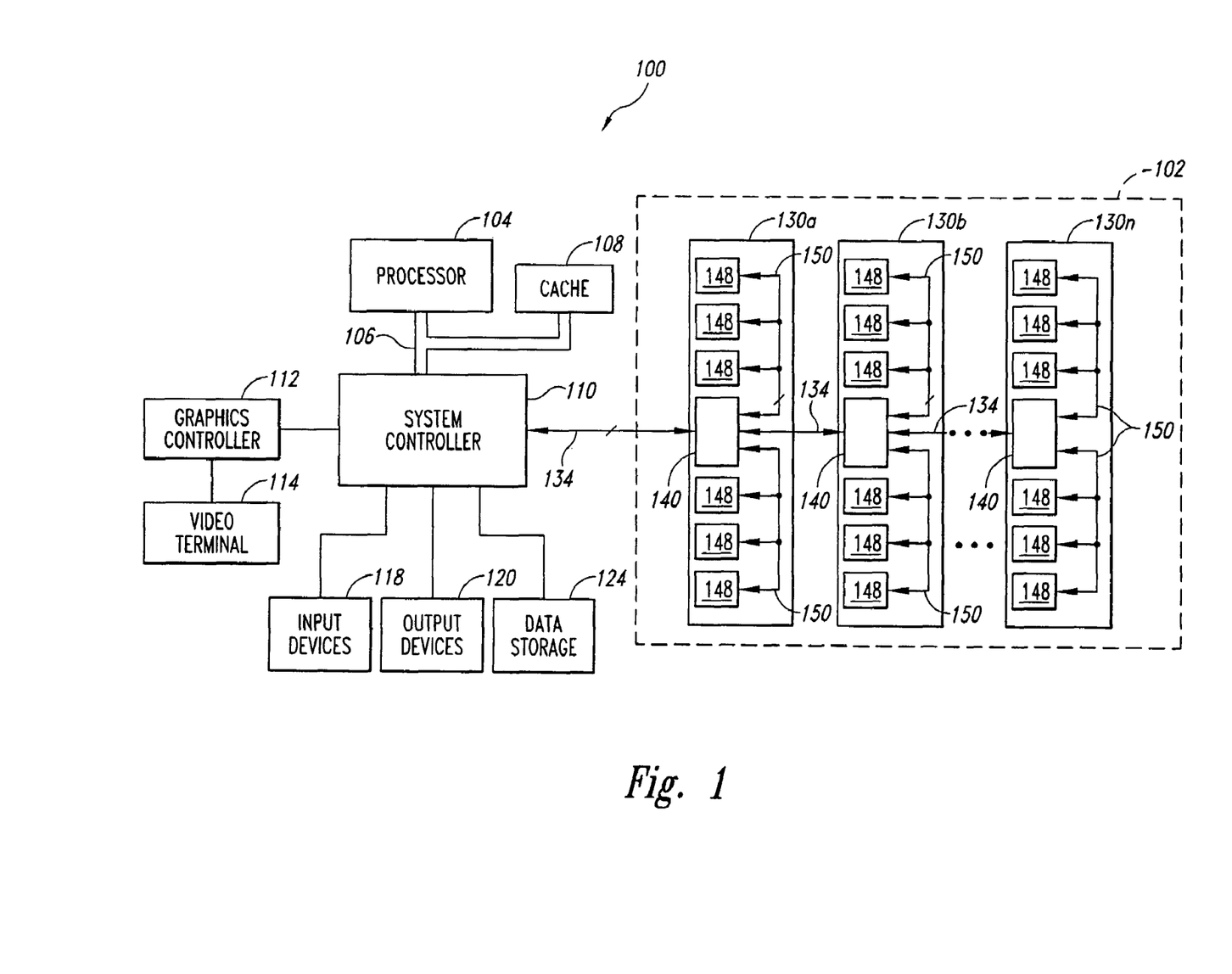
FIG. 1 is a block diagram of a computer system including a system memory having a high-bandwidth memory hub architecture according to one example of the present invention.

A computer system 100 according to one example of the present invention is shown in FIG. 1. The computer system 100 includes a system memory 102 having a memory hub architecture that efficiently forwards and processes downstream memory requests to provide a high bandwidth memory system, as will be explained in more detail below. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, as previously mentioned, is usually static random access memory ("SRAM"). Finally, the processor bus 106 is coupled to a system controller 110, which is also sometimes referred to as a "North Bridge" or "memory controller."

The system controller 110 serves as a communications path to the processor 104 for a variety of other components. More specifically, the system controller 110 includes a graphics port that is typically coupled to a graphics controller 112, which is, in turn, coupled to a video terminal 114. The system controller 110 is also coupled to one or more input devices 1118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 is further coupled to the system memory 102, which includes several memory modules 130a,b . . . n. The memory modules 130 are coupled in a point-to-point or daisy chain architecture through respective high speed links 134 coupled between the modules and the system controller 110. The high-speed links 134 may be optical, RF, or electrical communications paths, or may be some other suitable type of communications paths, as will be appreciated by those skilled in the art. In the event the high-speed links 134 are implemented as optical communications paths, each optical communication path may be in the form of one or more optical fibers, for example. In such a system, the system controller 110 and the memory modules 130 will each include an optical input/output port or separate input and output ports coupled to the corresponding optical communications paths.

Although the memory modules 130 are shown coupled to the system controller 110 in a daisy architecture, other topologies may also be used, such as a switching topology in which the system controller 110 is selectively coupled to each of the memory modules 130 through a switch (not shown), or a multi-drop architecture in which all of the memory modules 130 are coupled to a single high-speed link 134. Other topologies that may be used, such as a ring topology, will be apparent to those skilled in the art.

Each of the memory modules 130 includes a memory hub 140 for communicating over the corresponding high-speed links 134 and for controlling access to six memory devices 148, which are synchronous dynamic random access memory ("SDRAM") devices in the example FIG. 1. However, a fewer or greater number of memory devices 148 may be used, and memory devices other than SDRAM devices may, of course, also be used. The memory hub 140 is coupled to each of the system memory devices 148 through a bus system 150, which normally includes a control bus, an address bus, and a data bus.

Figure 2:
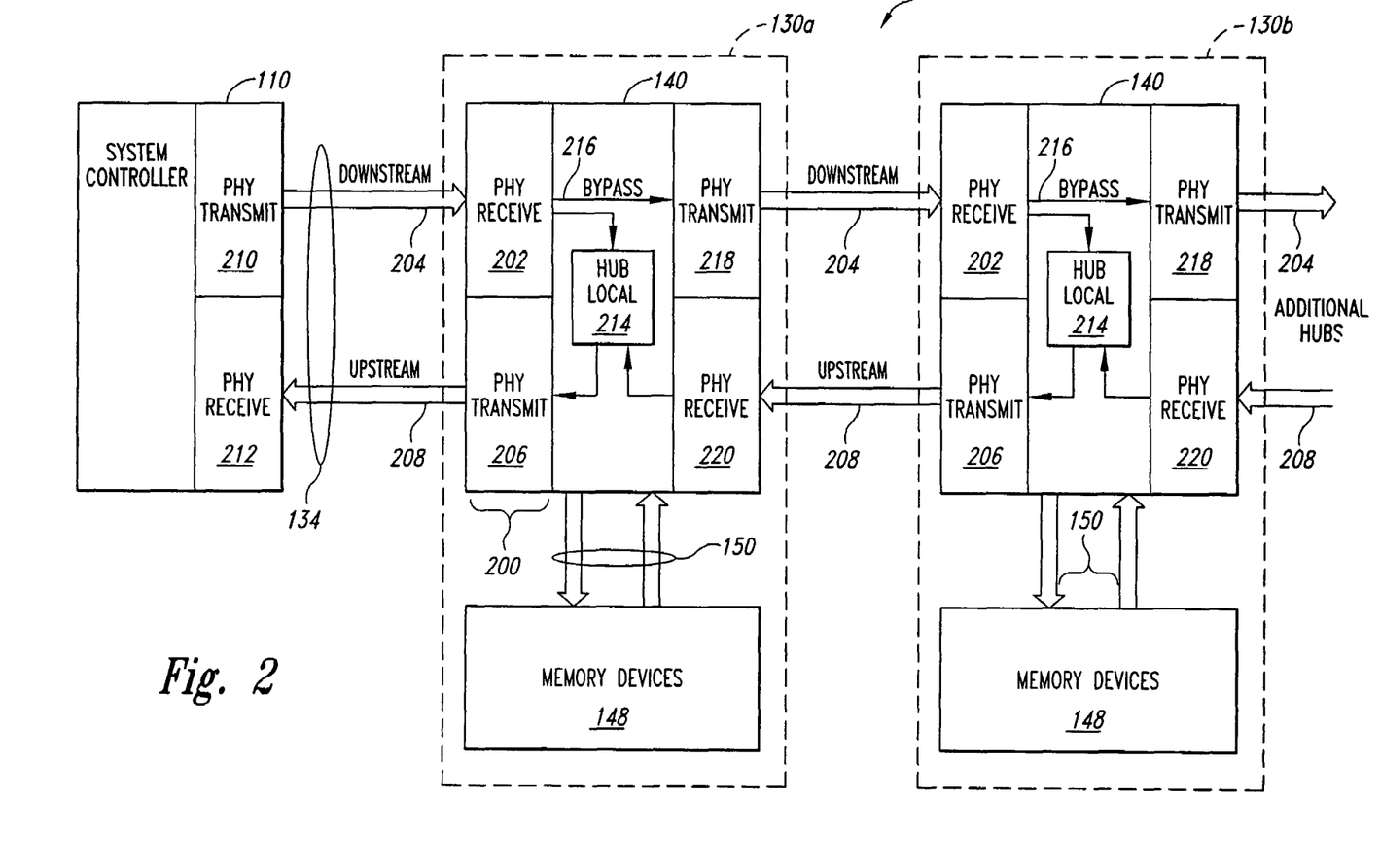
FIG. 2 is a block diagram illustrating the memory hubs contained in the memory modules in the system memory of FIG. 1 according to one example of the present invention.

One example of the memory hubs 140 of FIG. 1 is shown in FIG. 2, which is a block diagram illustrating in more detail the memory hubs in the memory modules 130a and 130b and link interface components in the system controller 110. In the memory module 130a, the memory hub 140 includes a link interface 200 that is connected to the high-speed link 134 coupled to the system controller 110. The link interface 200 includes a downstream physical reception port 202 that receives downstream memory requests from the system controller 110 over a downstream high-speed link 204, and includes an upstream physical transmission port 206 that provides upstream memory responses to the system controller over an upstream high-speed link 208. The downstream and upstream high-speed links 204, 208 collectively form the corresponding high-speed link 134.

The system controller 110 includes a downstream physical transmission port 210 coupled to the downstream high-speed link 204 to provide memory requests to the memory module 130a, and also includes an upstream physical reception port 212 coupled to the upstream high-speed link 208 to receive memory responses from the memory module 130a. The ports 202, 206, 210, 212 and other ports to be discussed below are designated "physical" interfaces or ports since these ports are in what is commonly termed the "physical layer" of a communications system. In this case, the physical layer corresponds to components providing the actual physical connection and communications between the system controller 110 and system memory 102 (FIG. 1), as will be understood by those skilled in the art.

The nature of the physical reception ports 202, 212 and physical transmission ports 206, 210 will depend upon the characteristics of the high-speed links 204, 208. For example, in the event the high-speed links 204, 208 are implemented using optical communications paths, the reception ports 202, 212 will convert optical signals received through the optical communications path into electrical signals and the transmission ports will convert electrical signals into optical signals that are then transmitted over the corresponding optical communications path.

The physical reception port 202 performs two functions on the received memory requests from the system controller 110. First, the reception port 202 captures the downstream memory request, which may be in the form of a packet and which may be referred to hereinafter as a memory request packet. The physical reception port 202 provides the captured memory request packet to local hub circuitry 214, which includes control logic for processing the request packet and accessing the memory devices 148 over the bus system 150 to provide the corresponding data when the request packet is directed to the memory module 130a.

The second function performed by the physical reception port 202 is providing the captured downstream memory request over a bypass path 216 to a downstream physical transmission port 218. The physical transmission port 218, in turn, provides the memory request packet over the corresponding downstream high-speed link 204 to the downstream physical reception port 202 in the adjacent downstream memory module 130b. The port 202 in module 130b operates in the same way as the corresponding port in the module 130a, namely to capture the memory request packet, provide the packet to local hub circuitry 214, and provide the packet over a bypass path 216 to a downstream physical transmission port 218. The port 218 in the module 130b then operates in the same way as the corresponding port in module 130a to provide the memory request packet over the corresponding downstream high-speed link 204 to the next downstream memory module 130c (not shown in FIG. 2).

The memory hub 140 in the module 130a further includes an upstream physical reception port 220 that receives memory response packets over the corresponding upstream high-speed link 208 from the upstream physical transmission port 206 in the module 130b. The reception port 220 captures the received memory request packets and provides them to the local hub circuitry 214 for processing. The precise manner in which each memory hub 140 processes the upstream response packets may vary and will not be discussed in more detail herein since it is not necessary for an understanding of the present invention.

In the system memory 102, each memory hub 140 captures the downstream memory request packets, supplies the captured packet to the local hub circuitry 214 for processing, and provides the packet to the memory hub on the next downstream memory module 130. With this approach, each memory hub 140 captures every downstream memory request packet and forwards the packet to the next downstream memory module 130. Thus, whether the packet is directed to a particular memory hub 140 or not, the packet is captured and each memory hub then processes the captured packet to determine if it is directed to that memory module 130. This approach simplifies the logic necessary to implement the local hub circuitry 214 and thus lowers the cost of each memory hub 140. This is true because the local hub circuitry 214 need not determine whether each memory request packet should be bypassed but instead all request packets are automatically bypassed. The term "bypassed" means to provide a memory request to the next downstream memory hub 140.

The present approach also reduces the delays in forwarding memory requests to downstream memory modules 130 and thus increases the bandwidth of the system memory 102. Capturing and forwarding of the memory request packets is done by the memory hubs 140 in the physical layer and thus in the clock domain of the downstream high-speed links 204. The clock rate of the high-speed links 204 is typically very fast, and thus there is a only a very small delay introduced by each memory hub 140 in bypassing each memory request packet. In contrast, the clock rate at which the local hub circuitry 214 in each memory hub 140 operates is much slower than the clock rate of the high-speed links 204. Thus, if each memory hub 140 determined whether a given request packet should be bypassed, the overall delay introduced by that hub would be much greater and the bandwidth of the system memory 102 lowered accordingly. This may also be viewed in terms of latency of the system memory 102, with greater delays introduced by the memory hubs 140 increasing the latency of the system memory. The clock domains of the high-speed links 204 and local hub circuitry 214 will be discussed in more detail below.

Figure 3:
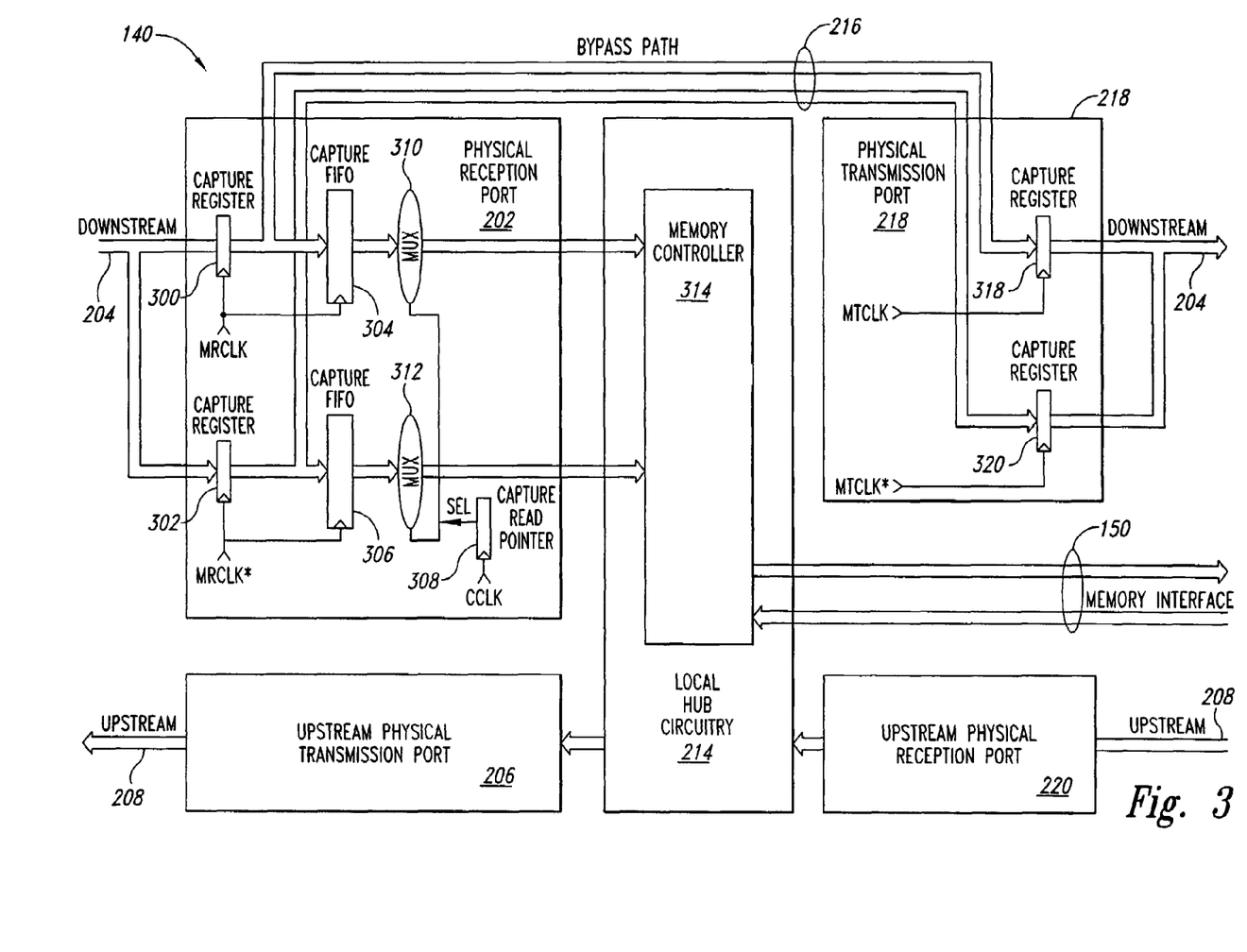
FIG. 3 is a more detailed block diagram the memory hubs of FIG. 2 according to one example of the present invention.

The physical reception port 202, bypass path 216, and physical transmission port 218 contained in the memory hubs 140 of FIG. 2 will now be discussed in more detail with reference to FIG. 3, which is a more detailed functional block diagram of these components according to one example of the present invention. In the following description, these components are assumed to be contained on the memory module 130a of FIG. 2. FIG. 3 does not depict interface circuitry that may be contained in the memory hubs 140 as well, such as when the high-speed links 204 are optical links and the memory hubs include interface circuitry for converting optical signals into electrical signals and vice versa, as will be appreciated by those skilled in the art.

The physical reception port 202 includes a pair of input capture registers 300, 302 coupled to the downstream high-speed link 204 and clocked by a pair of complementary master reception clock signals MRCLK, MRCLK* generated locally in the physical reception port 202. In this example, each memory request packet applied on the high-speed links 204 is formed by one or more data words DW that collectively form the packet, with the data words being applied on the high-speed data link. The MRCLK, MRCLK* signals are adjusted to have a particular phase shift relative to the data words DW, such as edges of these signals occurring in the center of a data eye of each data word, as will be understood by those skilled in the art. The capture register 300 latches a data word DW on the high-speed link 204 responsive to each rising edge of the MRCLK signal, and the capture register 302 latches a data word responsive to each rising edge of the MRCLK* signal. Each data word DW may contain data, address, or control information associated with a particular memory request.

The registers 300 and 302 apply the latched data words DW to capture first-in first-out (FIFO) buffers 304 and 306, respectively, which store the applied data words responsive to the MRCLK, MRCLK* signals. The FIFO buffers 304, 306 function to store a number of data words DW at a rate determined by the MRCLK, MRCLK* signals and thus in the clock domain of the high-speed link 204. The depth of the FIFO buffers 304, 306, which corresponds to the number of data words DW stored in the buffers, must be sufficient to provide a clock domain crossing from the high-speed clock domain of the downstream high-speed link 204 to the slower clock domain of the memory hub 140, as will be appreciated by those skilled in the art and as will be discussed in more detail below. A capture read pointer circuit 308 develops selection signals SEL responsive to a core clock signal CCLK, and applies the selection signals to control two multiplexers 310, 312. More specifically, the capture read pointer circuit 308 develops the SEL signals to selectively output groups of the data words DW stored in the FIFO buffers 304, 306 on a first-in first-out basis, where the two groups of data words from the multiplexers 310, 312 collectively correspond to a memory request packet on the high-speed link 204.

The CCLK clock is an internal clock signal of the memory hub 140 and thus defines a clock domain of the memory hub, as will be discussed in more detail below. The memory request packet from the multiplexers 310, 312 is applied to a memory controller 314 contained in the local hub circuitry 214, with the memory controller processing the memory request packet and taking the appropriate action in response thereto. For example, the memory controller 314 controls the transfer data over the bus system 150 to and from the memory devices 148 (not shown in FIG. 3) when the memory request packet is directed to the memory module 140.

The frequency of the CCLK signal is lower than the frequency of the MRCLK, MRCLK* signals, which is why the data words DW are stored in the FIFO buffers 304, 306 and then read out in groups under control of the capture read pointer circuit 308 and multiplexers 310, 312. The data words DW are thus latched by the capture registers 300, 302 and buffered in the FIFO buffers 304, 306 at a faster rate determined by the MRCLK, MRCLK* signals, and then read out of the FIFO buffers under control of the read pointer circuit 308 and multiplexers 310, 312 in groups at a slower rate determined by the CCLK signal.

The data words DW latched in the input capture registers 300, 302 are also provided to output capture registers 318, 320, respectively, and latched in the output capture registers responsive to master transmission clock signals MTCLK, MTCLK*. The MTCLK, MTCLK* signals are in the same clock domain as the MRCLK, MRCLK* signals, and would typically be derived from these clock signals. For example, the MRCLK and MRCLK* signals would typically be delayed to generate the MTCLK and MTCLK* signals, respectively, with the delay allowing the input capture registers 300, 302 to successfully latch the data words DW before the output capture registers 318, 320 latch these data words from the input capture registers.

Figure 4:
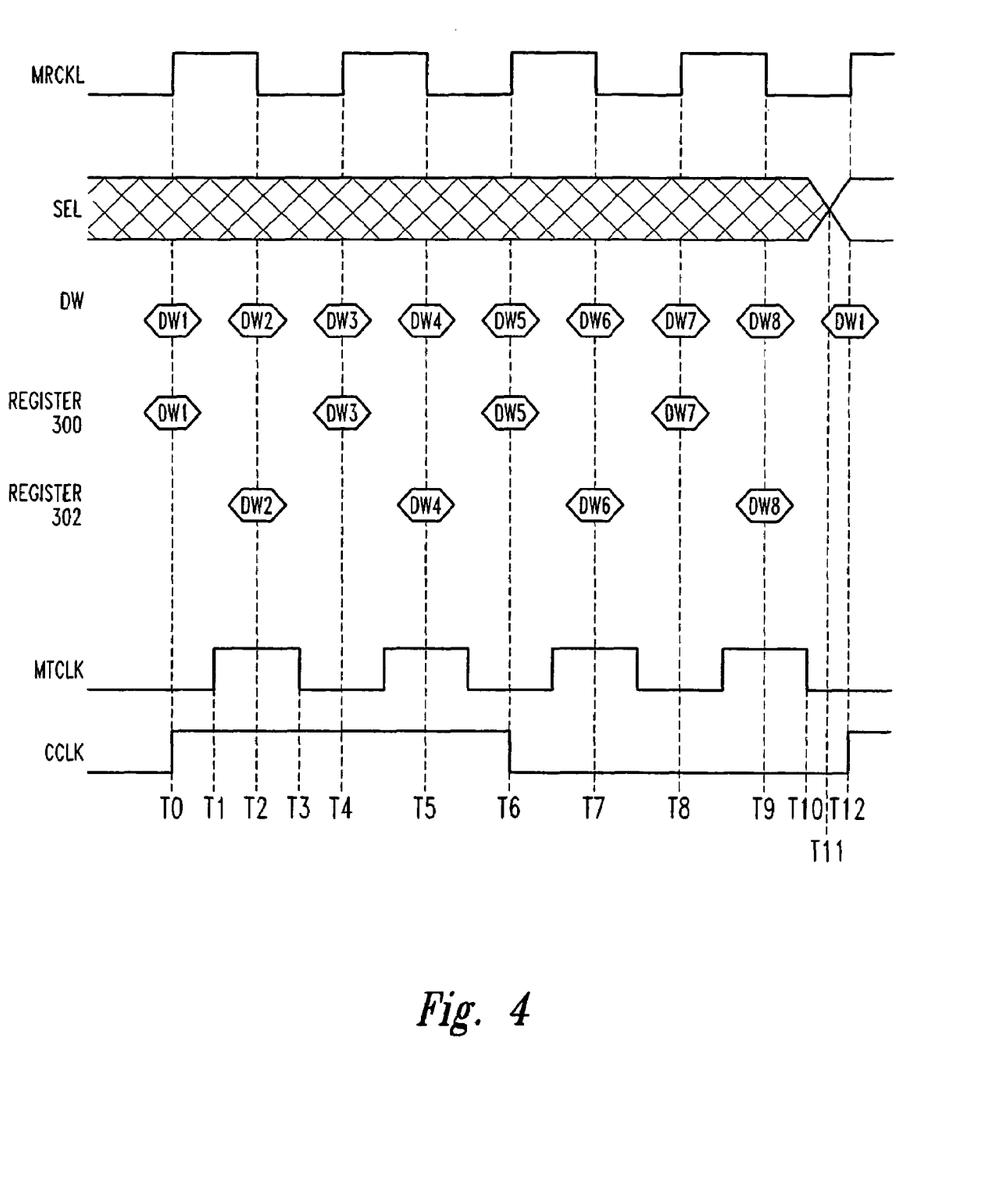
FIG. 4 is signal timing diagram illustrating the operation of the memory hub of FIG. 3 in capturing and forwarding downstream memory requests.

FIG. 4 is a signal timing diagram illustrating the operation of the memory hub 140 of FIG. 3 in more detail in capturing and bypassing data words DW applied to the memory hub. In the example of FIG. 4, the frequencies of the MRCLK, MRCLK*, MTCLK, MTCLK* signals are four times the frequency of the CCLK signal defining the clock domain of the memory hub 140. In operation, at a time T0 the input capture register 300 latches a first data word DW1 responsive to a rising edge of the MRCLK signal. This data word DW1 is latched by the output capture register 318 responsive to the MTCLK signal at a time T1 later. In this example, the MTCLK signal is delayed by a time T1–T2 relative to the MRCLK signal to ensure the data word DW1 is successfully stored in the input register 300 prior to the data word being latched by the output capture register 318. At a time T2, the input capture register 302 latches a second data word DW2 responsive to a rising edge of the MRCLK* signal (i.e., a falling edge of the MRCLK signal as shown in FIG. 4), and this data word is thereafter latched into the output capture register 320 at a time T3 responsive to a rising edge of the MTCLK* signal, which occurs at the same time as a falling edge of the MTCLK signal.

The input capture registers 300, 302 and output capture registers 318, 320 continue operating in this manner, each data word DW applied to the memory hub 140 being captured by the input capture registers and then applied to the output capture registers to thereby bypass the memory hub and provide these downstream data words to the next memory hub downstream. This capturing and bypassing occurs in the clock domain of the downstream high-speed links 204 and thus minimizes the delay introduced by each memory hub 140 in bypassing the downstream memory requests.

The data words DW captured in the input capture registers 300, 302 are also latched by the FIFO buffers 304, 306 responsive to the MRCLK, MRCLK* signals. The FIFO buffers 304, 306 are shown as being clocked by the MRCLK, MRCLK* signals for the sake of simplicity, and would actually be clocked by a signal derived from the MRCLK, MRCLK* signals, such as the MTCLK, MTCLK* signals, to ensure the data words DW are successfully stored in the input capture registers prior to the FIFO buffers latching the data words, as will be appreciated by those skilled in the art. Thus, each FIFO buffer 304, 306 latches the consecutive data words DW initially latched by the corresponding input capture register 300, 302.

The input capture registers 300, 302 and output capture registers 318, 320 continue operating in this manner to latch and bypass consecutive data words DW applied on the downstream high-speed link 204, as illustrated in FIG. 4 at times T4–T9. In the example of FIG. 4, each memory request is formed by 8 data words DW1–DW8 and each data word is 32 bits wide. After the last data word DW8 forming the memory request currently being transferred is latched in the input capture register 302 at time T9, this data word is latched into the FIFO buffer 306 at a time T10 responsive to the MRCLK* signal.

At this point, the entire memory request formed by the data words DW–DW8 has been latched into the FIFO buffers 304, 306, with the buffer 304 storing data words DW1, DW3, DW5, DW7 and the buffer 306 storing data words DW2, DW4, DW6, DW8. At a time T11, the read capture read pointer circuit 308 applies the SEL signals to collectively output the data words DW–DW8 from the multiplexers 310, 312 as the corresponding memory request. The memory controller 314 (FIG. 3) thereafter processes the memory request from the multiplexers 310, 312.

While the memory request formed by the data words DW–DW8 is being output from the multiplexers 310, 312, a next memory request is being applied on the high-speed link 204. At a time T12, the first data word DW1 of this next memory request is latched into the input capture register 300 responsive to the MRCLK signal. The memory hub 140 continues operating in this manner, with data words DW corresponding to a current memory request being applied on the high-speed link 204 being stored in the FIFO buffers 304, 306 while the previous memory request is output from the FIFO buffers. The capture read pointer circuit 308 develops the SEL signals to sequentially output the memory requests stored in the FIFO buffers 304, 306.

As previously mentioned, the depth of the FIFO buffers 304, 306 must be sufficient to allow the previous memory request to be output while a current memory request is being stored in the buffers. In the example of FIGS. 3 and 4, each of the buffers 304, 306 includes 12 storage locations, one for each data word DW. Thus, the buffers 304, 306 have a depth of 3 since they collectively store 3 consecutive memory requests. In this way, a current memory request may be stored a data word DW at a time in the FIFO buffers 304, 306 while the immediately prior memory request is stored in the buffers and the next prior memory request is output via multiplexers 310, 312 to the memory controller 314. The depth of the buffers 304, 306 may be varied, as will be appreciated by those skilled in the art. The buffers 304, 306 could have a minimum depth of 2, which would allow the currently applied memory request to be stored in the buffers as the prior memory request is output from the buffers. Using a depth of 3 or more for the buffers 304, 306, however, eases the timing constraints on components in the physical reception port 202 (FIG. 3), as will be appreciated by those skilled in the art.

The memory hub 140 of FIG. 3 captures downstream data words DW and bypasses these data words to the next memory hub downstream in clock domain of the downstream high-speed links 204. Because this capturing and bypassing occurs in the faster clock domain of the downstream high-speed links 204, the delay introduced by each memory hub 140 in capturing and bypassing the downstream memory requests is minimized. Moreover, this approach simplifies the logic necessary to implement the local hub circuitry 214 (FIG. 3), lowering the cost of each memory hub 140. In contrast, if each memory hub 140 determines whether a given memory request is directed to that hub and only bypasses requests not directed to the hub, the logic necessary to implement the local hub circuitry 214 would be much more complicated and thus the cost of each memory hub 140 would be higher. Each memory hub 140 would also introduce a greater delay of a given memory request with this approach, which would increase the latency of the system memory 102 (FIG. 1) and is a potential drawback to a daisy-chain architecture, as previously discussed.

One skilled in the art will understand suitable circuitry for forming the components of the memory hubs 140, and will understand that the components implemented would use digital and analog circuitry.

In the preceding description, certain details were set forth to provide a sufficient understanding of the present invention. One skilled in the art will appreciate, however, that the invention may be practiced without these particular details. Furthermore, one skilled in the art will appreciate that the example embodiments described above do not limit the scope of the present invention, and will also understand that various equivalent embodiments or combinations of the disclosed example embodiments are within the scope of the present invention. Illustrative examples set forth above are intended only to further illustrate certain details of the various embodiments, and should not be interpreted as limiting the scope of the present invention. Also, in the description above the operation of well known components has not been shown or described in detail to avoid unnecessarily obscuring the present invention. Finally, the invention is to be limited only by the appended claims, and is not limited to the described examples or embodiments of the invention.

The invention claimed is:

1. A memory hub, comprising:
   a reception port coupled to a bypass path, the reception port operable to receive memory requests;
   a memory controller coupled to the reception port, the reception port operable to concurrently supply a memory request to the bypass path and capture the memory request for supply to the memory controller; and
   a transmission port coupled to the bypass path, the transmission port operable to receive memory requests from the reception port without going through the memory controller.

2. The memory hub of claim 1, wherein the memory requests comprises a plurality of data words.

3. The memory hub of claim 1, wherein the reception port is a downstream physical reception port and the transmission port is a downstream physical transmission port.

4. The memory hub of claim 1, wherein the bypass path comprises:
   a plurality of conductive lines coupled between the reception and transmission ports.

5. The memory hub of claim 1, wherein the reception port comprises:
   a plurality of input capture registers coupled to the bypass path and configured to capture the memory request in response to a clock signal; and
   a plurality of first in first out buffers coupled to the input capture registers configured to store the memory requests.

6. The memory hub of claim 1, wherein the memory controller is coupled to a plurality of memory devices.

7. The memory hub of claim 6, wherein the frequency at which memory requests are supplied to the bypass path is greater than the frequency at which memory requests are supplied to the memory controller.

8. The memory hub of claim 7, wherein the reception port comprises:
   optical circuitry adapted to receive optical signals corresponding to the memory requests and to convert the received optical signals into corresponding electrical signals.

9. The memory hub of claim 8, wherein the transmission port comprises:
   optical circuitry that converts electrical signals corresponding to the memory requests into corresponding optical signals.

10. A memory system, comprising:
    a system controller;
    a plurality of memory modules, each memory module coupled to adjacent memory module, at least one memory module being coupled to the system controller, each memory module comprising:
      a plurality of memory devices;
      a reception port coupled to a bypass path, the reception port operable to receive memory requests;
      a memory controller coupled to the reception port, the reception port operable to concurrently supply a memory request to the bypass path and capture the memory request for supply to the memory controller; and
      a transmission port coupled to the bypass path, the transmission port operable to receive memory requests from the reception port without going through the memory controller.

11. The memory system of claim 10, wherein the memory requests comprises a plurality of data words.

12. The memory system of claim 10, wherein the frequency at which memory requests are supplied to the bypass path is greater than the frequency at which memory requests are supplied to the memory controller.

13. The memory system of claim 10, wherein each memory module is coupled to adjacent memory modules through high-speed communication links, and the at least one memory module is coupled to the system controller through high-speed communication links.

14. The memory system of claim 13, wherein the high-speed communication links comprises an optical communication link.

15. The memory system of claim 10, wherein the reception port comprises:
  a first input capture register coupled to the bypass path and configured to latch a data word in response to a first clock signal;
  a second input capture register coupled to the bypass path and configured to latch a data word in response to a second clock signal; and
  a plurality of first in first out buffers coupled to the input capture registers configured to store the memory requests.

16. The memory system of claim 15, wherein the reception port comprises:
  a capture read pointer circuit configured to selectively output a plurality of data words stored in the plurality of first in first out buffers.

17. A computer system, comprising:
  a central processing unit;
  a system controller coupled to the central processing unit;
  an input device coupled to the system controller;
  an output device coupled to the system controller;
  a plurality of memory modules, each memory module coupled to adjacent memory module, at least one memory module being coupled to the system controller, each memory module comprising:
    a plurality of memory devices;
    a reception port coupled to a bypass path, the reception port operable to receive memory requests;
    a memory controller coupled to the reception port, the reception port operable to concurrently supply a memory request to the bypass path and capture the memory request for supply to the memory controller; and
    a transmission port coupled to the bypass path, the transmission port operable to receive memory requests from the reception port without going through the memory controller.

18. The computer system of claim 17, wherein the frequency at which memory requests are supplied to the bypass path is greater than the frequency at which memory requests are supplied to the memory controller.

19. The computer system of claim 17, wherein each memory module is coupled to adjacent memory modules through high-speed communication links, and the at least one memory module is coupled to the system controller through high-speed communication links.

20. The computer system of claim 19, wherein the high-speed communication links comprises an optical communication link.

21. The computer system of claim 17, wherein the memory requests comprises a plurality of data words.

22. The computer system of claim 21, wherein the reception port comprises:
  a first input capture register coupled to the bypass path and configured to latch a data word in response to a first clock signal;
  a second input capture register coupled to the bypass path and configured to latch a data word in response to a second clock signal; and
  a plurality of first in first out buffers coupled to the input capture registers configured to store the memory requests.

23. The computer system of claim 22, wherein the reception port comprises:
  a capture read pointer circuit configured to selectively output a plurality of data words stored in the plurality of first in first out buffers.

24. A method of processing a memory request in a system memory, comprising:
  receiving a data word in a reception port of a memory hub;
  capturing the data word in the reception port for transmission to a memory controller; and
  concurrent with capturing the data word, transmitting the data word from the reception port to a transmission port without going through the memory controller.

25. The method of claim 24 comprising:
  forwarding each data word to the next downstream memory hub.

26. The method of claim 24 comprising:
  forwarding each data word from each memory controller to a plurality memory devices coupled to each memory controller.

27. The method of claim 24, wherein receiving a data word in a reception port of a memory hub comprises:
  latching each data word responsive to a first clock signal in a first clock domain.

28. The method of claim 24, wherein a plurality of data words comprises a memory request.

29. The method of claim 24, wherein the frequency at which memory requests are transmitted to the transmission port is greater than the frequency at which memory requests are transmitted to the memory controller.

30. The method of claim 24, wherein transmitting the memory request from the reception port to a transmission port comprises traveling through a high-speed communication link.

31. The method of claim 30, wherein the high-speed communication link comprises an optical communication link.

* * * * *